United States Patent
Takeuchi et al.

[19]
[11] Patent Number: 5,824,158
[45] Date of Patent: Oct. 20, 1998

[54] CHEMICAL VAPOR DEPOSITION USING INDUCTIVELY COUPLED PLASMA AND SYSTEM THEREFOR

[75] Inventors: Koichiro Takeuchi, Nishiwaki; Hirokazu Ueda; Akira Narai, both of Kobe, all of Japan

[73] Assignee: Kabushiki Kaisha Kobe Seiko Sho, Kobe, Japan

[21] Appl. No.: 917,803

[22] Filed: Aug. 27, 1997

Related U.S. Application Data

[63] Continuation of Ser. No. 266,468, Jun. 27, 1994, abandoned.

[30] Foreign Application Priority Data

| Jun. 30, 1993 | [JP] | Japan | 5-151441 |
| Jun. 30, 1993 | [JP] | Japan | 5-161442 |
| Jun. 30, 1993 | [JP] | Japan | 5-161443 |
| Jun. 30, 1993 | [JP] | Japan | 5-161444 |

[51] Int. Cl.$^6$ .................................................. C23C 16/00
[52] U.S. Cl. ................. 118/723 IR; 118/723 I; 118/715; 118/664; 118/712; 204/298.03; 204/298.07; 315/111.51; 156/345
[58] Field of Search .................... 118/723 I, 723 IR, 118/715, 664, 712; 204/298.03, 298.07; 315/111.51; 156/345

[56] References Cited

U.S. PATENT DOCUMENTS

| 4,066,037 | 1/1978 | Jacob | 118/48 |
| 4,579,623 | 4/1986 | Suzuki | 156/626 |
| 4,713,140 | 12/1987 | Tein | 156/626 |

(List continued on next page.)

FOREIGN PATENT DOCUMENTS

| 53-138943 | 12/1978 | Japan | 156/345 |
| 1-240655 | 9/1989 | Japan | 204/298.03 |
| 2-5413 | 1/1990 | Japan . | |
| 4-16704 | 1/1992 | Japan | 204/298.03 |
| 4-82214 | 3/1992 | Japan | 118/712 |
| 4-92444 | 3/1992 | Japan | 118/712 |
| 4-362091 | 12/1992 | Japan | 118/723 I |
| 5-242997 | 9/1993 | Japan . | |
| WO 89/06354 | 7/1989 | WIPO | 118/712 |

OTHER PUBLICATIONS

Pliskin, Alternating Wavelength Vampo, IBM Technical Disclosure Bulletin, vol. 13 No. 3, pp. 672–673, Aug. 1970.

*Primary Examiner*—R. Bruce Breneman
*Assistant Examiner*—Jeffrie R. Lund
*Attorney, Agent, or Firm*—Oblon, Spivak, McClelland, Maier & Neustadt, P.C.

[57] ABSTRACT

An ICP (Inductively Coupled Plasma) system is used as a plasma generating means. A CVD process gas is introduced within a vacuum vessel from a gas inlet nozzle, and is then converted into plasma by a high frequency electric field induced within the vacuum vessel by an electromagnetic wave from an antenna. A sample can be located at a position not to be exposed to plasma, and a decomposed product material produced from the CVD process gas by the plasma is deposited on the surface of the sample mounted on a sample stage, thus forming a film. A dielectric viewing port, the antenna and the sample are disposed along the same axial direction such that the directions of the planes thereof correspond to each other, so that the film formation on the surface of the sample within the vacuum vessel can be observed through the transparent dielectric viewing port. When a CVD process gas of a CVD source gas mixed with a rare gas is introduced in the vacuum vessel and a bias voltage is applied to the sample, the film is formed by the CVD source gas and it is simultaneously planarized by sputter etching by the rare gas. When an antenna serving as a target material is disposed within the vacuum vessel, it is possible to eliminate the cutoff of the high frequency power which, has been generated for the inductive coupling from the outside of the vacuum vessel.

4 Claims, 10 Drawing Sheets

U.S. PATENT DOCUMENTS

| | | | |
|---|---|---|---|
| 4,771,730 | 9/1988 | Tezuka | 118/723 |
| 4,846,920 | 7/1989 | Keller | 156/345 |
| 5,082,517 | 1/1992 | Moslehi | 156/345 |
| 5,091,320 | 2/1992 | Aspnes | 437/8 |
| 5,110,437 | 5/1992 | Yamada | 204/298.33 |
| 5,122,251 | 6/1992 | Campbell | 204/298.06 |
| 5,226,967 | 7/1993 | Chen | 118/723 |
| 5,261,962 | 11/1993 | Hamamoto | 118/723 |
| 5,266,154 | 11/1993 | Tatsumi | 156/643 |
| 5,276,503 | 1/1994 | Hayashi | 356/369 |
| 5,277,747 | 1/1994 | Aspnes | 156/626 |
| 5,290,381 | 3/1994 | Nozawa | 156/345 |
| 5,304,279 | 4/1994 | Coultas | 156/345 |
| 5,346,578 | 9/1994 | Benzing | 156/345 |
| 5,387,309 | 2/1995 | Bobel | 117/85 |
| 5,391,260 | 2/1995 | Makino et al. | 156/646 |
| 5,433,812 | 7/1995 | Cuomo | 156/345 |
| 5,468,298 | 11/1995 | Lei et al. | 118/728 |
| 5,529,657 | 6/1996 | Ishii | 156/345 |
| 5,531,834 | 7/1996 | Ishizuka | 118/723.1 |
| 5,540,821 | 7/1996 | Tepman | 204/298.13 |
| 5,571,366 | 11/1996 | Ishii | 156/345 |
| 5,695,832 | 12/1997 | Hirano et al. | 427/577 |
| 5,707,692 | 1/1998 | Suzuki | 427/562 |

CHEMICAL VAPOR DEPOSITION USING INDUCTIVELY COUPLED PLASMA AND SYSTEM THEREFOR

This application is a Continuation of application Ser. No. 08/266,468, filed on Jun. 27, 1994, now abandoned.

BACKGROUND OF THE INVENTION

1. Field of the Invention

The present invention relates to a plasma CVD system for use in a fabrication process for semiconductor integrated circuits, and particularly to a plasma CVD system including an ICP (Inductively Coupled Plasma) system for forming a film with less impurities.

In the fabrication process of semiconductor integrated circuits, a plasma CVD (Chemical Vapor Deposition) technique is used to form insulating films on a semiconductor substrate before wiring, to embed via holes, and to form passivation films. The plasma CVD systems used for such a CVD process include a parallel plate plasma CVD system, and an ECR plasma CVD system.

The parallel plate plasma CVD system has a construction schematically shown in FIG. 13.

In FIG. 13, a parallel plate plasma CVD system 20 has an upper electrode 22 and a lower electrode 23, each of which is formed into a flat plate, are disposed within a vacuum vessel 21 in parallel to each other. A high frequency power is applied to the upper electrode 22 from a high frequency power supply. A sample 24 to be treated is mounted on the lower electrode 23, and which is connected to grounding potential. As shown in the figure, when a CVD process gas is introduced within the vacuum vessel 21 by way of a flow passage provided in the upper electrode 22, plasma is generated between the electrodes 22 and 23 by application of high frequency power, and a decomposed product material produced from the CVD process gas by the plasma is deposited on the sample 24, thus forming a film on the surface of the sample 24.

Moreover, other than the parallel plate plasma CVD system, an ECR plasma system using ECR (Electron Cyclotron Resonance) plasma is well known. The ECR plasma CVD system lies a feature in that a high density plasma (electron density: about $1 \times 10^{11}$–$10^{12}$/cm$^3$) can be obtained in a vacuum under a relatively low pressure ranging from several tens to several hundreds of mTorr. The CVD system using plasma generated under a relatively low pressure has an advantage in making longer the mean free path of a source gas thereby achieving the film formation excellent in step coverage. The ECR CVD system has a construction schematically shown in FIG. 14.

Referring to FIG. 14, in an ECR plasma CVD system 26, a microwave is introduced within the vacuum vessel 27 from a dielectric viewing port 28 provided in the axial direction of a cylindrical vacuum vessel 27, while a magnetic field is applied within the vacuum vessel 27 from a magnetic field generating coil 31 disposed coaxially with the vacuum vessel 27. A sample 29 is mounted on a sample stage 30 disposed at a specified position along the axial direction of the vacuum vessel 27, and a CVD process gas is introduced within the vacuum vessel 27. An ECR plasma is thus generated within the vacuum vessel 27 and the decomposed product material produced from the CVD gas by the plasma is deposited on the sample 29, thus forming a film on the sample 29.

In recent years, there have been strong demands in the field of the semiconductor integrated circuit toward high integration. To meet the demands, the dense and high quality film must be formed. However, in the above-described diode parallel plate CVD system, since the bulk plasma is generated between the electrodes, the sample makes contact with the bulk plasma including the plasma generation region in which various compounds are highly decomposed, therefore these compounds produced by the plasma are necessarily entrapped in the deposited film. For example, for growth of a silicon dioxide ($SiO_2$) film, a silane gas ($SiH_4$) and a dinitrogen monoxide ($N_2O$) gas are generally used as a CVD process gas. Moreover, an organic liquid material such as tetra-ethyl-ortho-silicate (TEOS) is vaporized by a vaporizing apparatus such as a bubbler, to thus obtain the process gas. Preferably, the silicon dioxide film to be deposited never contain a silanol (—OH) component, hydrocarbon, a hydrogen component, nitride, organic matters and heavy metal, which deteriorate electric characteristics (electric breakdown and leak current resistance). However, when the source gas is, for example constituted of silane gas and dinitrogen monoxide, the plasma contains almost all of compounds produced by the combination of elements of Si, H, N and O. Accordingly, impurities such as O, H and N are entrapped in the silicon dioxide film actually deposited by the plasma CVD, which deteriorates the densification and electric characteristics of the film. In general, it is well known that the silicon dioxide film formed by the parallel plate plasma CVD system contains hydrogen in a large amount. The above-described problem is true for a silicon nitride film, amorphous silicon film, tungsten film, and tungsten silicide film.

As described above, the parallel plate plasma CVD system has a disadvantage that the sub-reaction product material generated in plasma tends to be entrapped in the deposited film because the surface of the samples makes contact with the bulk plasma. Moreover, in the parallel plate plasma CVD system, since each electrode is made of carbon graphite, aluminum oxide, stainless steel or the like, the sample might be contaminated by heavy metal. The plasma CVD process technique having the fear that impurities are entrapped in the film is difficult to form a dense and high quality film for satisfying the demands toward high integration.

On the other hand, in the above-described ECR plasma CVD system, the sample is not directly exposed to the bulk plasma, including the plasma generation region in which various compounds are highly decomposed, and thereby a sub-reaction product material is not entrapped in a film. However, this system has a disadvantage in terms of the construction. Namely, it is difficult to uniformly generate ECR by the combination of a magnetic field and a microwave. To deal with an 8-inch wafer (sample) mainly used for the present semiconductor fabrication process, the system must be provided with a considerably large magnetic field generating coil. This causes a problem in increasing both the cost and the installation space along with the enlargement of the system.

Moreover, in the ECR plasma CVD system, the uniformity of plasma is dependent on the plasma parameters which strongly depend on the vessel wall conditions including the dielectric viewing port which changes the microwave absorption conditions. When the vessel wall including the viewing port is contaminated by the deposition of a CVD film, the deposition rate of the film becomes uneven on the sample surface, or between the samples, because the wall conditions change the plasma parameters which affects the microwave absorption conditions. The contamination of the vessel wall including the dielectric viewing port can usually be solved by cleaning it; however this cleaning is not easily performed because the magnetic field generating coil is located around the dielectric viewing port which can be access to clean inside the vessel.

The present inventors have focussed on an ICP system as a plasma generating means capable of forming a film by CVD without exposure of a sample in the bulk plasma including the plasma generation region in which various compounds are highly decomposed, and of generating a high density plasma with a large extension with a simple structure. The prior art CVD system using ICP has a disadvantage in terms of practical use. However, a high density plasma with a large extension can be achieved by improvement in an antenna of applying a high frequency power for plasma generation. The present inventors have examined such a plasma CVD system using ICP as to reduce the inclusion of impurities in a film formed on a sample, and to keep the heating temperature of the sample necessary for CVD process at a high temperature.

SUMMARY OF THE INVENTION

Accordingly, a first object of the present invention is to provide a plasma CVD system including an ICP system as a plasma generating means and capable of forming a film with a high quality.

In the ECR plasma CVD system, plasma density is directly affected by the uniformity of the distribution density of the microwave introduced in the vacuum vessel and the microwave absorption conditions just above the plasma generation region. This harms the film shape, deposition rate, and planarized shape for the case that the planarization for the film is simultaneously performed, and the uniformity between samples. Provided that the radiation from a waveguide is made uniform, the non-uniformity of the microwave absorption conditions just above the plasma generation region is affected by the condition of the vessel wall including the dielectric viewing port. That is, when the dielectric viewing port is contaminated by the deposition of decomposed product material produced by the plasma, the distribution density of plasma becomes uneven, which generates the above-mentioned defects in the film. The contamination of the dielectric viewing port can be solved by usually cleaning the dielectric viewing port; however, the cleaning is difficult to be performed because the magnetic field generating coil is disposed around it.

To cope with the above problem, the present inventors has focussed on the plasma using an ICP system as a plasma generating means capable of generating a high density plasma in a large extension with a simple structure, and of generating plasma under the condition that the generation of plasma is not directly affected by the non-uniformity of the introduced high frequency power. The prior art plasma CVD system using the ICP system has a disadvantage in terms of the practical use. However, a high density plasma with a large extension can be obtained by improving an antenna for applying a high frequency power for plasma generation.

A second object of the present invention is to provide a plasma CVD process and a plasma system, which includes an ICP system as a plasma generating means, and performs the planarization for the film along with the film formation.

In the prior art plasma CVD system, it is impossible to observe the surface of the sample during film formation. To set the thickness of a film formed by the CVD, the deposition rate in the system where the target film thickness is set is calculated, and the target film formation time must be set.

A third object of the present invention is to provide a plasma CVD system including an ICP system as a plasma generating means capable of forming a high quality film with no impurities, and of observing the surface of a sample and measuring the film thickness thereby controlling the film formation; and a plasma CVD process using the above system.

In the present invention, an ICP system is used as a means capable of generating a high density plasma with a relatively simple structure. In the ICP system, a high frequency power is supplied to an antenna wound in a coil shape around the outer periphery of a cylindrical vacuum vessel formed of a quartz tube. Thus a high frequency electric field is formed within the vacuum vessel, to form plasma from a process gas introduced within the vacuum vessel.

However, the prior art plasma generating means using ICP has a disadvantage that since the generation of plasma is limited to the area near the antenna, it is difficult to obtain an extensive range of plasma because of the deviation of the plasma density. As a result, it cannot be used for a semiconductor wafer having a large diameter. Moreover, the prior art plasma generating means using ICP is not suitable for sputtering like metal deposition, because a high frequency power to the vacuum vessel is cut-off by the deposition of metal films on the inner surface of the vacuum vessel.

The present inventors has found the fact that the plasma with a large extension can be generated by improvement in the shape of an antenna for inducing a high frequency electric field within a vacuum vessel, and have solved the above problems by improving the shape and the position of the antenna.

A fourth object of the present invention is to provide a plasma CVD system capable of obtaining a high density plasma by an ICP system and performing sputtering using the plasma thus obtained.

A first invention for achieving the first object provides a plasma CVD system of introducing a CVD process gas within a vacuum vessel applied with a high frequency power for forming plasma from the CVD process gas, and depositing a decomposed product material generated by the plasma on a sample disposed within the vacuum vessel, comprising:

a vacuum vessel including a gas inlet nozzle for introducing the CVD process gas and a antenna for introducing the high frequency power;

an antenna disposed outwardly from and in close proximity to the dielectric viewing port for inducing a high frequency electric field within the vacuum vessel by applying the high frequency power in the vacuum vessel; and a sample stage disposed at a specified position within the vacuum vessel, a sample mounting portion of which is made of quartz glass, and which includes a heating means for heating the sample mounted thereon at a specified temperature.

As described above, according to the first invention, when a specified CVD process gas is introduced from the gas inlet nozzle within the vacuum vessel while a high frequency power is supplied to the antenna disposed in the close proximity to the dielectric viewing port, a high frequency electric field is induced within the vacuum vessel by an electromagnetic wave from the antenna, thus producing plasma from the CVD process gas by the high frequency electric field. The plasma generated by the ICP system is not affected by the propagation state of the electromagnetic wave so much. Consequently, as compared with the ECR plasma, the uniformity of the plasma is not directly affected by the contamination of the vessel wall including the dielectric viewing port. Since the plasma is generated at the position in close proximity to the antenna within the vacuum vessel, the sample can be disposed at the position not to be exposed by the bulk plasma, and thereby the decomposed product material produced from the CVD process gas by the plasma is deposited on the surface of the sample mounted on the sample stage. Therefore, it is possible to solve the inclusion of the impurities into the film because the sample is not exposed to the bulk plasma including plasma generation region in which various compounds are highly decomposed, and the mounting portion of the sample stage is made of quartz glass. Moreover, the mounting potion of the sample stage made of quartz makes it possible to set the heating temperature for the sample to be higher. The chemical reaction of CVD is dependent on the temperature, and in many cases, the reaction is performed at high temperatures; consequently, the higher upper limit of the heating temperature is effective for the CVD system. Moreover, by use of the gas inlet nozzle is made of quartz glass, it is possible to prevent the inclusion of impurities to the introduced CVD process gas.

A second invention for achieving the second object provides a plasma CVD process using an ICP (inductively Coupled Plasma) system of introducing a CVD process gas within a vacuum vessel applied with a high frequency power for forming plasma from the CVD process gas, and depositing a decomposed product material generated by the plasma on a sample disposed within the vacuum vessel, comprising the steps of:

applying the high frequency power in the vacuum vessel from an antenna disposed in close proximity to a dielectric viewing port provided on the vacuum vessel for inducing a high frequency electric field within the vacuum vessel;

introducing the CVD process gas of a CVD source gas mixed with a rare gas in the vacuum vessel for forming plasma from the CVD process gas by the high frequency electric field;

depositing a decomposed product material generated from the CVD source gas by the plasma on the sample applied with a bias voltage and heated at a specified temperature; and planarizing the deposited CVD film by anisotropic etching with the decomposed product material of the rare gas.

To carry out the second invention, there is provided a plasma CVD system of introducing a CVD process gas within a vacuum vessel applied with a high frequency power for forming plasma from the CVD process gas, and depositing a decomposed product material generated by the plasma on a sample disposed within the vacuum vessel, comprising:

a vacuum vessel including a gas inlet nozzle for introducing the CVD process gas and a dielectric viewing port for introducing the high frequency power;

an antenna disposed in close proximity to the dielectric viewing port for inducing a high frequency electric field within the vacuum vessel by applying the high frequency power in the vacuum vessel from the dielectric viewing port; and a sample stage movably disposed within the vacuum vessel for applying a high frequency bias voltage to the sample mounted thereon and for heating the sample at a specified temperature.

According to the second invention, when a CVD process gas of a CVD source gas mixed with a rare gas is introduced within the vacuum vessel from the gas inlet nozzle, while a high frequency power is supplied to the antenna disposed in close proximity to the dielectric viewing port, a high frequency electric field is induced within the vacuum vessel by an electromagnetic wave from the antenna, thus forming plasma from the CVD process gas. Since the generation of plasma by the ICP system is difficult to be affected by the propagation state of the high frequency power into the vacuum vessel, the uniformity of plasma is little affected by the contamination of the dielectric viewing port compared with the ECR plasma process. This makes it possible to stably obtain the uniformity of the plasma density, and hence to uniformly form a film and planarize it. Using a CVD process gas of a CVD source gas mixed with a rare gas and by applying a bias voltage to the sample, the film is formed by the CVD source gas and it is simultaneously planarized by sputter etching by the rare gas. The process for the formation and planarization of the film is affected by the uniformity of the plasma density. Consequently, the film formation is uniformly performed on the surface of each sample or between samples in a fabrication line by the plasma being stable in uniformity using the ICP system.

A third invention for achieving the third object provides a plasma CVD system of introducing a CVD process gas within a vacuum vessel applied with a high frequency power for forming plasma from the CVD process gas, and depositing a decomposed product material generated by the plasma on a sample disposed within the vacuum vessel, comprising:

a dielectric viewing port disposed on the outer periphery of the vacuum vessel;

an antenna disposed in close proximity to the dielectric viewing port provided outside of the vacuum vessel for inducing a high frequency electric field within the vacuum vessel; and a sample stage for holding the sample at a specified position within the vacuum vessel;

wherein the dielectric viewing port, the antenna and the sample stage are disposed along the axis of the vacuum vessel such that the directions of the planes thereof correspond to each other.

According to the third invention, when a high frequency power is supplied to the antenna disposed in close proximity to the dielectric viewing port provided on the outer periphery of the vacuum vessel, a high frequency electric field is induced within the vacuum vessel by an electromagnetic wave from the antenna. The high frequency electric field forms plasma from a CVD process gas introduced within the vacuum vessel. Thus, a decomposed product material generated by the plasma is deposited on a sample disposed within the vacuum vessel, thus forming a film on the surface of the sample.

A fourth invention provides a plasma CVD system of introducing a CVD process gas within a vacuum vessel applied with a high frequency power for forming plasma from the CVD process gas, and depositing a decomposed product material generated by the plasma on a sample disposed within the vacuum vessel, comprising:

a dielectric viewing port which is disposed on the outer periphery of the vacuum vessel, and which includes a gas passage connected to an inlet port for the CVD process gas and a gas discharge port for discharging the process gas in the gas passage within the vacuum vessel;

an antenna formed in a loop, which is disposed in close proximity to the dielectric viewing port provided outside of the vacuum vessel for inducing a high frequency electric field within the vacuum vessel; and a sample stage for holding the sample at a specified position within the vacuum vessel;

wherein the dielectric viewing port, the antenna and the sample stage are disposed along the axis of the vacuum vessel such that the directions of the planes thereof correspond to each other.

According to the fourth invention, the gas passage for a CVD process gas and the gas discharge port opened to the vacuum vessel are provided on the dielectric viewing port, in addition to the construction of the third invention. The CVD process gas is introduced within the vacuum vessel through the gas passage and the gas discharge port, so that the process gas is uniformly supplied to the plasma generation area, and the inclusion of impurities is prevented.

A fifth invention provides a plasma CVD system of introducing a CVD process gas within a vacuum vessel applied with a high frequency power for forming plasma from the CVD process gas, and depositing a decomposed product material generated by the plasma on a sample disposed within the vacuum vessel, comprising:

a dielectric viewing port formed of a transparent dielectric with a diameter larger than that of the sample, which is disposed on the outer periphery of the vacuum vessel, and which includes a gas passage connected to an inlet port for the CVD process gas and a gas discharge port for discharging the process gas in the gas passage within said vacuum vessel;

an antenna formed in a loop with a diameter larger than that of the sample, which is disposed in close proximity to the dielectric viewing port provided outside of the vacuum vessel for inducing a high frequency electric field within the vacuum vessel; and a sample stage for holding the sample at a specified position within the vacuum vessel;

wherein the dielectric viewing port, the antenna and the sample stage are disposed along the axis of the vacuum vessel such that the directions of the planes thereof correspond to each other.

According to the fifth invention, in addition to the fourth invention, the transparent dielectric viewing port is formed to be larger in diameter than the sample. The antenna is also formed to be larger in diameter than the sample. The dielectric viewing port, antenna and sample are disposed along the same axial direction such that the directions of the planes thereof correspond to each other, so that the film formation on the surface of a sample within the vacuum vessel can be observed through the transparent dielectric viewing port.

A sixth invention provides a plasma CVD system of introducing a CVD process gas within a vacuum vessel applied with a high frequency power for forming plasma from the CVD process gas, and depositing a decomposed product material generated by the plasma on a sample disposed within the vacuum vessel, comprising:

a dielectric viewing port formed of a transparent dielectric with a diameter larger than that of the sample, which is disposed on the outer periphery of the vacuum vessel, and which includes a gas passage connected to an inlet port for the CVD process gas and a gas discharge port for discharging the process gas in the gas passage within the vacuum vessel;

an antenna formed in a loop with a diameter larger than that of the sample, which is disposed in close proximity to the dielectric viewing port provided outside of the vacuum vessel for inducing a high frequency electric field within the vacuum vessel; and a sample stage for holding the sample at a specified position within the vacuum vessel;

the dielectric viewing port, the antenna and the sample stage being disposed along the axis of the vacuum vessel such that the directions of the planes thereof correspond to each other; and a film thickness measuring device disposed at a position in which a detection light is emitted to the sample by way of the dielectric viewing port and receives the light reflected from a film deposited on the surface of the sample, thereby measuring the film thickness of the deposited film by the analysis of the reflected light.

According to the sixth invention, in addition to the construction of the fifth invention, the film thickness measuring device is provided for usually measuring the thickness of a film on the surface of a sample during the film formation within the vacuum vessel. Accordingly, it is possible to measure the distribution of a film on the sample, and to control the system to be stopped when the film thickness becomes a specified value.

A seventh invention provides a plasma CVD process using a plasma CVD system, the system including:

a dielectric viewing port formed of a transparent dielectric with a diameter larger than that of the sample, which is disposed on the outer periphery of the vacuum vessel, and which includes a gas passage connected to an inlet port for the CVD process gas and a gas discharge port for discharging the process gas in the gas passage within the vacuum vessel;

an antenna formed in a loop with a diameter larger than that of the sample, which is disposed in close proximity to the dielectric viewing port provided outside of the vacuum vessel for inducing a high frequency electric field within the vacuum vessel; and a sample stage for holding the sample at a specified position within the vacuum vessel;

the dielectric viewing port, the antenna and the sample stage being disposed along the axis of the vacuum vessel such that the directions of the planes thereof correspond to each other, and a film thickness measuring device disposed at a position in which a detection light is emitted to the sample by way of the dielectric viewing port and receives the light reflected from a film deposited on the surface of the sample, thereby measuring the film thickness of the deposited film by the analysis of the reflected light, whereby the CVD process is introduced within the vacuum vessel is converted into plasma by a high frequency electric field inducted within the vacuum vessel, and a decomposed product material generated by the plasma is deposited on the sample, the method comprising the steps of:

measuring the thickness of the deposited film on the surface of the sample during the film deposition by the film thickness measuring device, and stopping the supply of the high frequency power to the antenna when the measured value becomes a specified film thickness.

The seventh invention concerns the CVD process using the construction according to the sixth invention, wherein the thickness of a film on a sample is measured by the film thickness measuring device, and the high frequency power from the antenna is controlled to be stopped when the measured value becomes a specified film thickness, thus forming the film with a constant film thickness.

A eighth invention provides a plasma CVD process using a plasma CVD system, the system including:

a dielectric viewing port formed of a transparent dielectric with a diameter larger than that of the sample, which is disposed on the outer periphery of the vacuum vessel, and which includes a gas passage connected to an inlet port for the CVD process gas and a gas discharge port for discharging the process gas in the gas passage within the vacuum vessel;

an antenna formed in a loop with a diameter larger than that of the sample, which is disposed in close proximity to the dielectric viewing port provided outside of the vacuum vessel for inducing a high frequency electric field within the vacuum vessel; and a sample stage for holding the sample at a specified position within the vacuum vessel;

the dielectric viewing port, the antenna and the sample stage being disposed along the axis of the vacuum vessel such that the directions of the planes thereof correspond to each other, and a film thickness measuring device disposed at a position in which a detection light is emitted to the sample by way of the dielectric viewing port and receives the light reflected from a film deposited on the surface of the sample, thereby measuring the film thickness of the deposited film by the analysis of the reflected light, whereby the CVD process gas introduced within the vacuum vessel is converted into plasma by a high frequency electric field inducted within the vacuum vessel, and a decomposed product material generated by the plasma is deposited on the sample, the method comprising the steps of:

measuring the thickness of the deposited film on the surface of the sample by the film thickness measuring device, and changing either or both of components and mixing ratio of a CVD source gas, reaction gas and rare gas constituting the CVD process gas when the measured value becomes a specified film thickness, thereby continuously forming CVD films of different kinds.

The eighth invention shows the CVD process for continuously forming films of a plurality of kinds using the construction of the sixth invention, wherein the thickness of a film on a sample is measured by the film thickness measuring device, and either or both of components and mixing ratio of the CVD process gas are changed when the measured value becomes a specified film thickness, thus subsequently forming a film of a different material.

A ninth invention for achieving the fourth object provides a sputtering system using an ICP system comprising:

an antenna which induces a high frequency electric field within a vacuum vessel by a high frequency power applied within the vacuum vessel from the antenna for forming plasma from a process gas or rare gas introduced within the vacuum vessel by the high frequency electric field; and a target material which is applied with a bias voltage to be subjected to sputtering by ions produced by the plasma, thereby forming a thin film on a sample disposed within the vacuum vessel by sputter particles, wherein the antenna is formed of the target, and which is disposed so as to be freely contacted with the ions in the plasma generation area within the vacuum vessel.

As described above, in the ICP system of the ninth invention, the antenna for inducing a high frequency electric field in the vacuum vessel is disposed in the vacuum vessel, and the antenna serves as the target material. Even if the shape of the antenna is simplified, there is no problem in generating plasma by the ICP system. Since being thus formed into a simple shape, the antenna can be disposed within the vacuum chamber. At the same time, by forming the antenna into a shape suitable for the target material, the antenna and the target material are simultaneously disposed within the generated plasma. Since the antenna is disposed within the vacuum chamber, is possible to eliminate the cut-off of the high frequency power which has been generated in the prior art construction by the inductive coupling from the outside of the vacuum vessel, and hence perform the stable sputtering.

A tenth invention for achieving the fourth object provides a method of cleaning a plasma CVD system for inducing a high frequency electric field within a vacuum vessel from an antenna disposed in close proximity to a dielectric viewing port provided on the vacuum vessel for forming plasma from a CVD gas introduced within the vacuum vessel, thereby depositing a decomposed product material generated by the plasma on a sample within the vacuum vessel, the method comprising the steps of:

performing the plasma CVD process by introducing a CVD process gas within the vacuum vessel; and introducing a fluorine gas in place of the CVD gas within the vacuum vessel, thereby cleaning the interior of the CVD system by the plasma produced from the fluorine gas.

According to the tenth invention, after the CVD process is performed wherein the CVD process gas is introduced in the vacuum vessel, a fluorine gas is introduced in the vacuum vessel in place of the CVD process gas to generate the plasma, thus removing the CVD film stuck on the dielectric viewing port by the etching due to plasma. The cleaning renews the transparent state of the dielectric viewing port and the introducing state of the high frequency power. The stable CVD film is continuously obtained by usually performing the cleaning.

DETAILED DESCRIPTION OF THE PREFERRED EMBODIMENTS

Hereinafter, embodiments of the present invention will be described with reference to the accompanying drawings. It is to be understood, however, that the embodiments are illustrative only but not restrictive.

Figure 1:
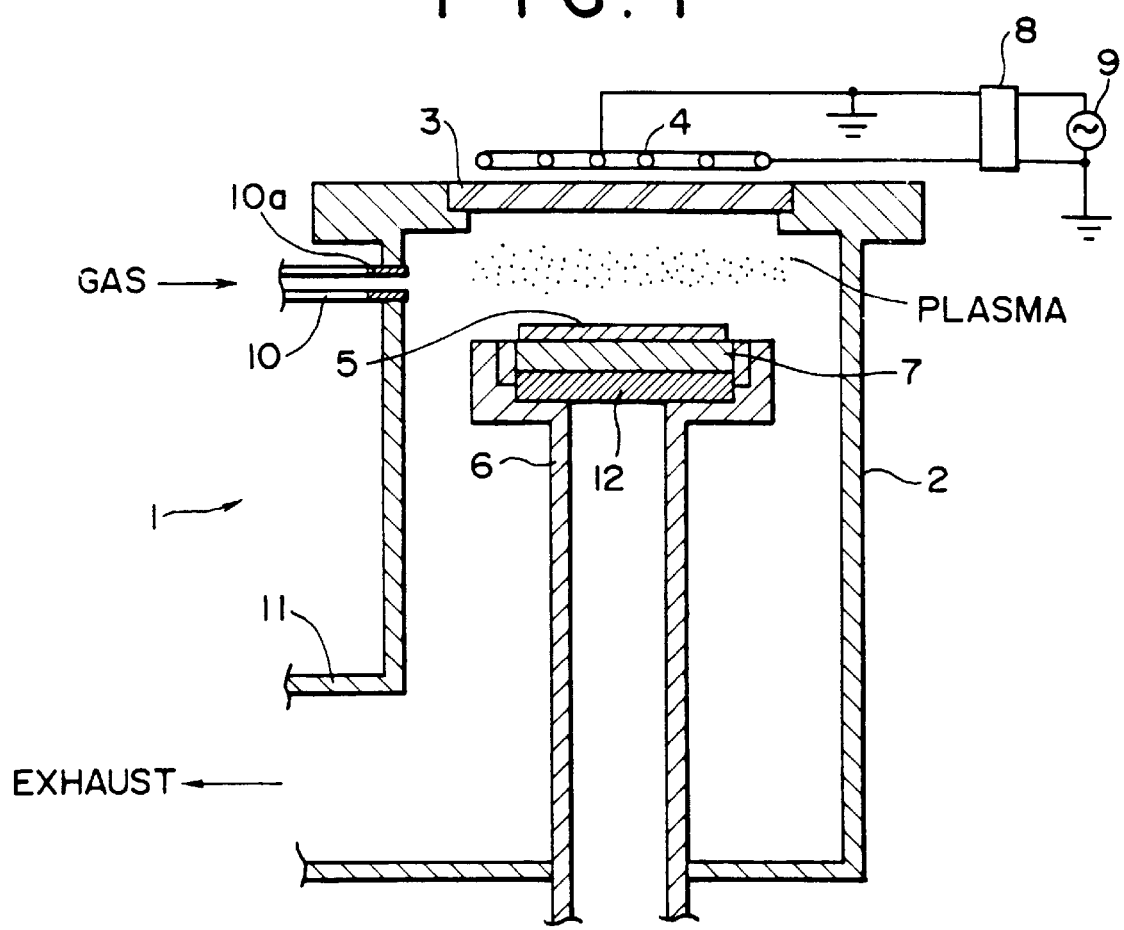
FIG. 1 is a schematic view showing the construction of a plasma CVD system according to an embodiment of the present invention.
Figure 2:
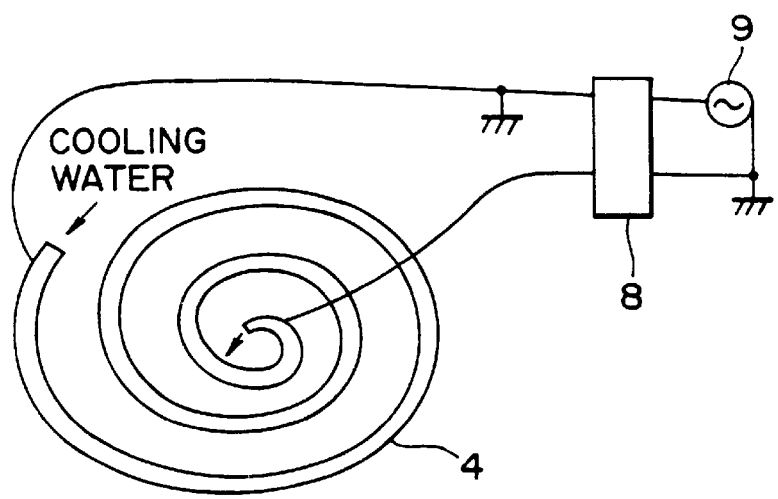
FIG. 2 is a schematic view showing the example of the construction of an antenna of the embodiment shown in FIG. 1.

FIG. 1 is a schematic view showing a plasma CVD system according to one embodiment of the first invention. FIG. 2 is an example of the shape of an antenna according to the embodiment, which is a plan view of an antenna of the embodiment shown in FIG. 1.

Referring to FIG. 1, a cylindrical type plasma CVD system 1 of this embodiment includes a vacuum vessel 2 having a gas inlet 10 and an exhaust port 11 for evacuation; a dielectric viewing port 3 provided along the center axis of the vacuum vessel 2; an antenna 4 disposed outwardly from and in close proximity to the dielectric viewing port 3; a high frequency power supply 9 for supplying a high frequency power to the antenna 4 by way of a matching circuit 8; a susceptor 7 for mounting a sample 5, which is disposed so as to movable to a specified height along the center axis of the vacuum vessel 2; a sample stage 6 including a heating means (heater) 12 for heating the sample 5 at a specified temperature by way of the susceptor 7.

The antenna 4 may be formed in, for example, a spiral shape shown in FIG. 2, which is adapted to radiate a high frequency power supplied from the high frequency power supply 9 for inducing a high frequency electric field within the vacuum vessel 2.

The susceptor 7 is made of a quartz glass for preventing the inclusion of impurities to the sample 4 mounted thereon. Moreover, by the susceptor 7 made of quartz glass, when the sample is heated by the heater 12 provided on the rear surface of the susceptor 7, the upper limit of the heating temperature can be greater.

A gas inlet nozzle 10a, which is adapted to jet a CVD process gas within the vacuum vessel 2 from the gas inlet 10, is also made of quartz glass to prevent the inclusion of impurities in the CVD process gas.

In this embodiment, the film formation is performed for the sample 5 such as a 6 inch-silicon wafer by the plasma CVD system 1 having the above construction. The sample 5 is mounted on the susceptor 7 provided on the sample stage 6. The vacuum vessel 12 is evacuated through the exhaust port 11 by means of an exhaust pump (not shown). Silane ($SiH_4$) and dinitrogen monoxide gas ($N_2O$) with the separately controlled flow rates are then introduced in the vacuum vessel 2 from the gas inlet 10. In the film formation process of this embodiment, 100 to 1000 W of a high frequency power (frequency: 13.56 MHz) is supplied from the high frequency power supply to the antenna 4, and silane and dinitrogen monoxide gas are introduced in the vacuum vessel 2 with respective flow rates of 100 sccm and 500 sccm. Subsequently, the 6 inch-silicon wafer as the sample 5 is heated at a temperature between 300° and 400° C. under a gas pressure between 10 and 1000 mTorr. Moreover, the distance between the sample 5 and the dielectric viewing port 3 is changed within the range from 1 to 30 cm by the movement of the sample stage 6.

In the above-described process, when the specified CVD process gas is introduced from the gas inlet nozzle 10a in the vacuum vessel 2 while a high frequency power is supplied to the antenna disposed in the close proximity to the dielectric viewing port 3, a high frequency electric field is induced within the vacuum vessel by the effect of an electromagnetic wave from the antenna. The high frequency electric field accelerates electrons generated within the vacuum vessel 2 by natural radiation and the like. The accelerated electrons collide with neutral atoms in the CVD process gas, to ionize the neutral atoms into ions and electrons, thus generating initial plasma. The newly generated electrons are accelerated by the high frequency electric field, to produce ions and electrons. This process is repeated. When the plasma density is thus increased somewhat, the electron density in the bulk plasma is increased, thereby increasing the responsive frequency of the electrons in the bulk plasma. As a result, the bulk plasma acts as an electric conductor, so that a current flows in a manner to shield the high frequency electric field, thereby starting the cut-off of the electromagnetic wave. At this time, since the electromagnetic wave does not enter the interior of the bulk plasma other than the special mode inherent to the plasma, only the plasma particles on the surface of the bulk plasma obtain the energy of the electromagnetic wave from the antenna, to increase the plasma density, thus diffusing within the bulk plasma.

The decomposed product material produced by the plasma thus generated is deposited on the sample 5. Since the portion (on which a film is deposited) of the surface of the sample 5 can be located at the position not to be directly exposed to the plasma by the movement of the sample stage 6, there can be formed a dense CVD film without inclusion of impurities. Moreover, since any conductor is not disposed at the position to be exposed to the plasma within the vacuum vessel 2, the sample 5 is not contaminated. Additionally, since the nozzle of the gas inlet 10 is made of quartz glass, it is possible to prevent the inclusion of impurities in the CVD process gas, and hence to ensure the dense CVD film without impurities.

Under the process condition according to this embodiment, the heating temperature for the sample 5 is set at a temperature between 300° to 400° C. However, since the susceptor 7 is made of quartz glass, the upper limit of the heating temperature for the sample 5 can be increased from about 500° C. (prior art) to about 1100° C. Thus, the process temperature can be set to be higher according to the CVD process condition. This achieves the CVD process with a high quality in association with the exclusion of impurities.

As described above, according to the first invention, when a specified CVD process gas is introduced from the gas inlet nozzle within the vacuum vessel while a high frequency power is supplied to the antenna disposed in the close proximity to the dielectric viewing port, a high frequency electric field is induced within the vacuum vessel by an electromagnetic wave from the antenna, thus producing plasma from the CVD process gas by the high frequency electric field. The plasma generated by the ICP system is not affected by the propagation state of the electromagnetic wave so much. Consequently, as compared with the ECR plasma, the uniformity of the plasma is not directly affected by the contamination of the dielectric viewing port. Since the plasma is generated at the position in close proximity to the antenna within the vacuum vessel, the sample can be disposed at the position not to be exposed by the plasma, and thereby the decomposed product material produced from the CVD process gas by the plasma is deposited on the surface of the sample mounted on the sample stage. Therefore, it is possible to solve the inclusion of impurities into the film because the sample is not exposed to the plasma, and the mounting portion of the sample stage is made of quartz glass. Moreover, when the mounting potion of the sample stage is made of quartz, it is possible to set the heating temperature for a higher sample. The chemical reaction of CVD is dependent on the temperature, and in many cases, the reaction is performed at high temperatures; consequently, the higher upper limit of the heating temperature is effective for the CVD system.

Figure 3:
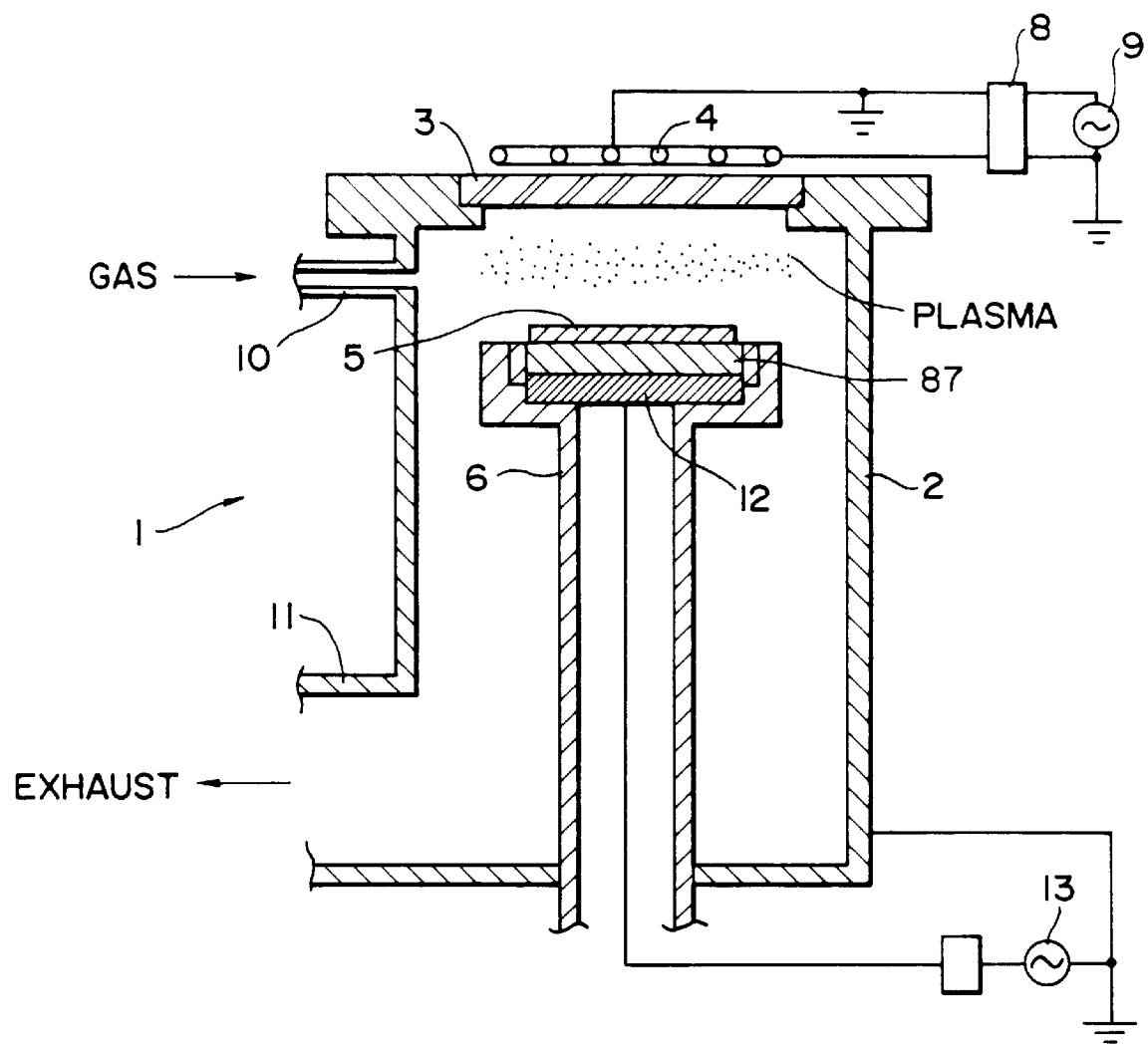
FIG. 3 is a schematic view showing the construction of a plasma CVD system according to an embodiment of a second invention.

FIG. 3 shows a plasma CVD system 1 for carrying out the second invention. The cylindrical type plasma CVD system 1 includes a vacuum vessel 2 having a gas inlet 10 and an exhaust port 11 for evacuation; a dielectric viewing port provided along the center axis of the vacuum vessel 2; an antenna 4 disposed in the close proximity to the dielectric viewing port 3; a high frequency power supply 9 for supplying a high frequency power to the antenna 4 by way of a matching circuit 8; a bias electrode 87 disposed so as to be movable at a specified position along the center axis of the vacuum vessel 2 for applying a high frequency bias voltage to the sample 5 by means of a high frequency bias power supply 13; and a sample stage 6 having a heater 12 for heating the sample 5 at a specified heating temperature through the bias electrode 87.

Figure 4A:
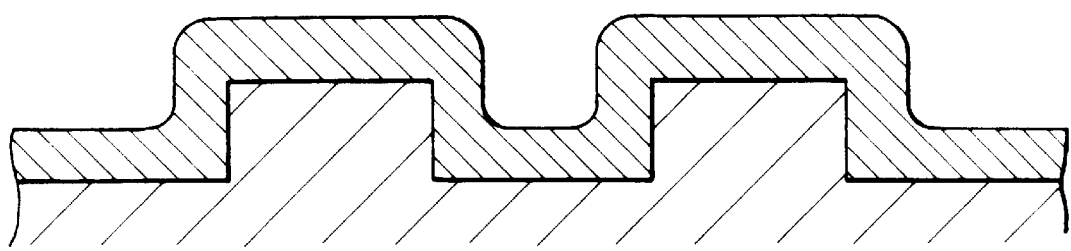
FIGS. 4A to 4C are schematic views for illustrating a planarization process for a film according to an embodiment.
Figure 4B:
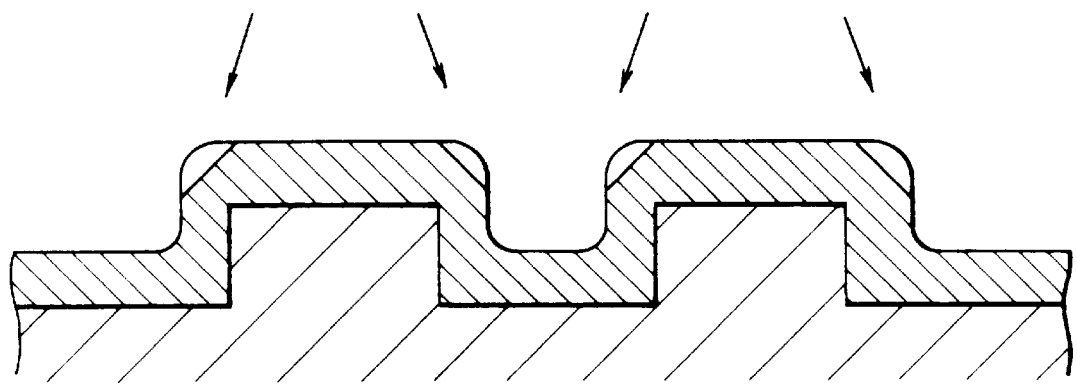
Figure 4C:
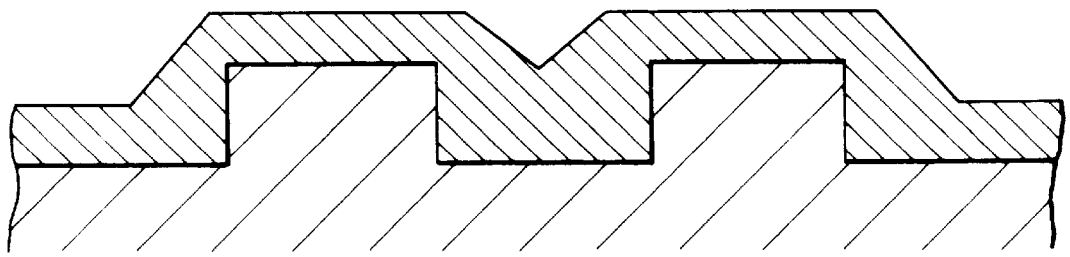

In this embodiment, the silicon dioxide film is formed and simultaneously it is planarized, so that a rare has such as Ar gas is mixed with the CVD process gas. Ar atoms are attracted to the sample 5 applied with a high frequency bias, thus performing physically anisotropic sputter etching. The planarization of the film is shown in FIGS. 4A to 4C. A film is formed on an irregular surface of the sample 5 by CVD, as shown in FIG. 4A. The film is subjected to supper etching by Ar atoms, as shown in FIG. 4B. Thus, the film is planarized, as shown in FIG. 4C.

As described above, in the plasma CVD process by the ICP system, the generation of plasma is not directly affected by the non-uniformity of the high frequency power due to the deposition of the product material by plasma to the dielectric viewing port, so that the film can be stably formed.

According to the second invention, the plasma CVD system includes the plasma generating means using the ICP system, wherein the film is formed by CVD and simultaneously it is planarized by introducing a CVD process gas of a CVD source gas mixed with a rare gas in the vacuum vessel, and applying a bias voltage to the sample. The plasma by the ICP system is not directly affected by the non-uniformity of the high frequency power due to the contamination of the dielectric viewing port, so that the uniformity of the plasma density is stabilized. This makes it possible to uniformly form the film and planarized it. Since the plasma CVD system has a simple structure without any magnetic field, it becomes possible to reduce the cost of the system and to easily perform the maintenance of the interior of the system such as cleaning.

FIGS. 5 to 8 shows embodiments for carrying out the third to ninth inventions.

Figure 5:
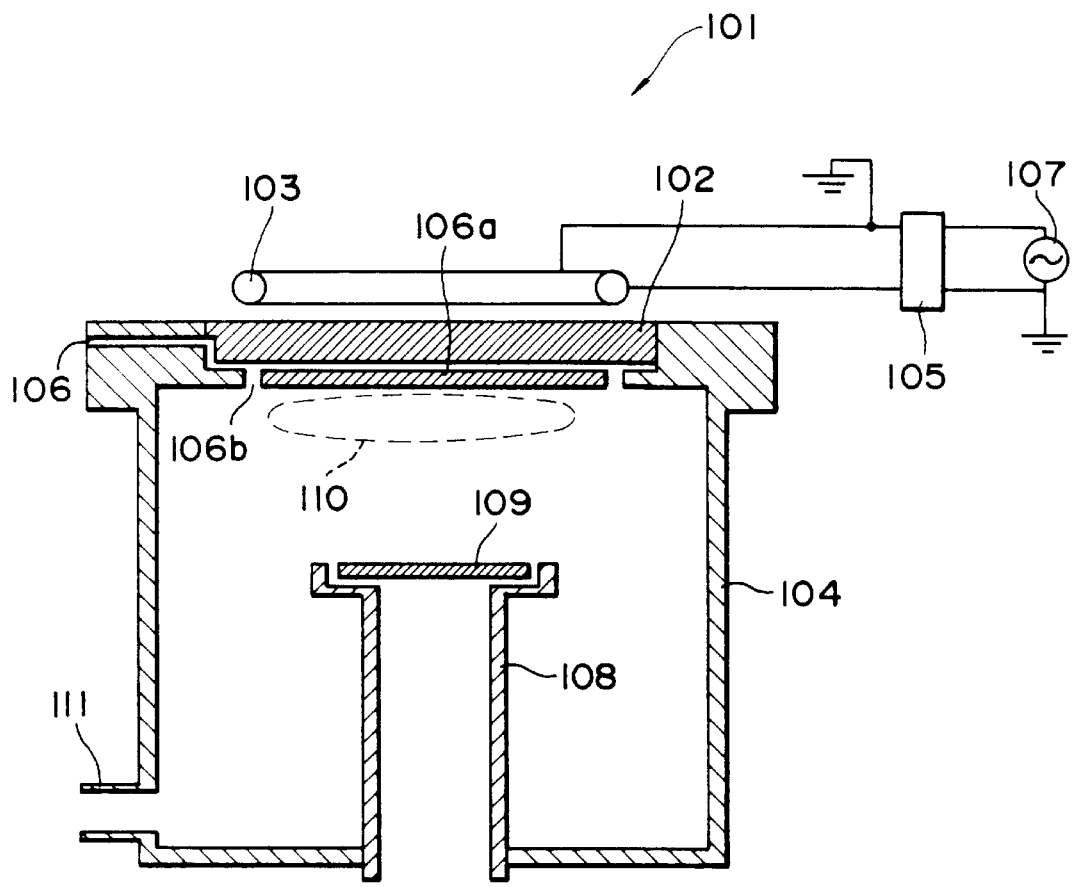
FIG. 5 is a schematic view showing the construction of a plasma CVD system according to an embodiment of a third invention.
Figure 6:
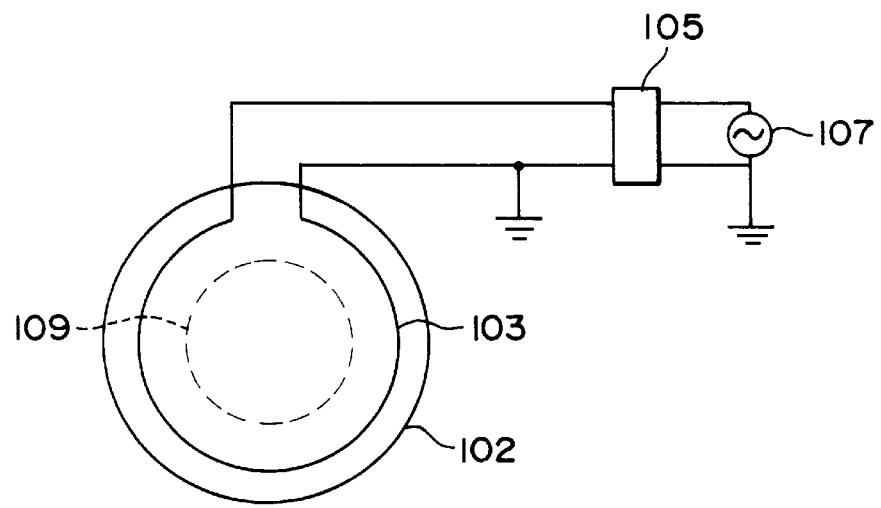
FIG. 6 is a schematic view showing the state where a sample is observed through a dielectric viewing port according to the embodiment shown in FIG. 5.
Figure 7:
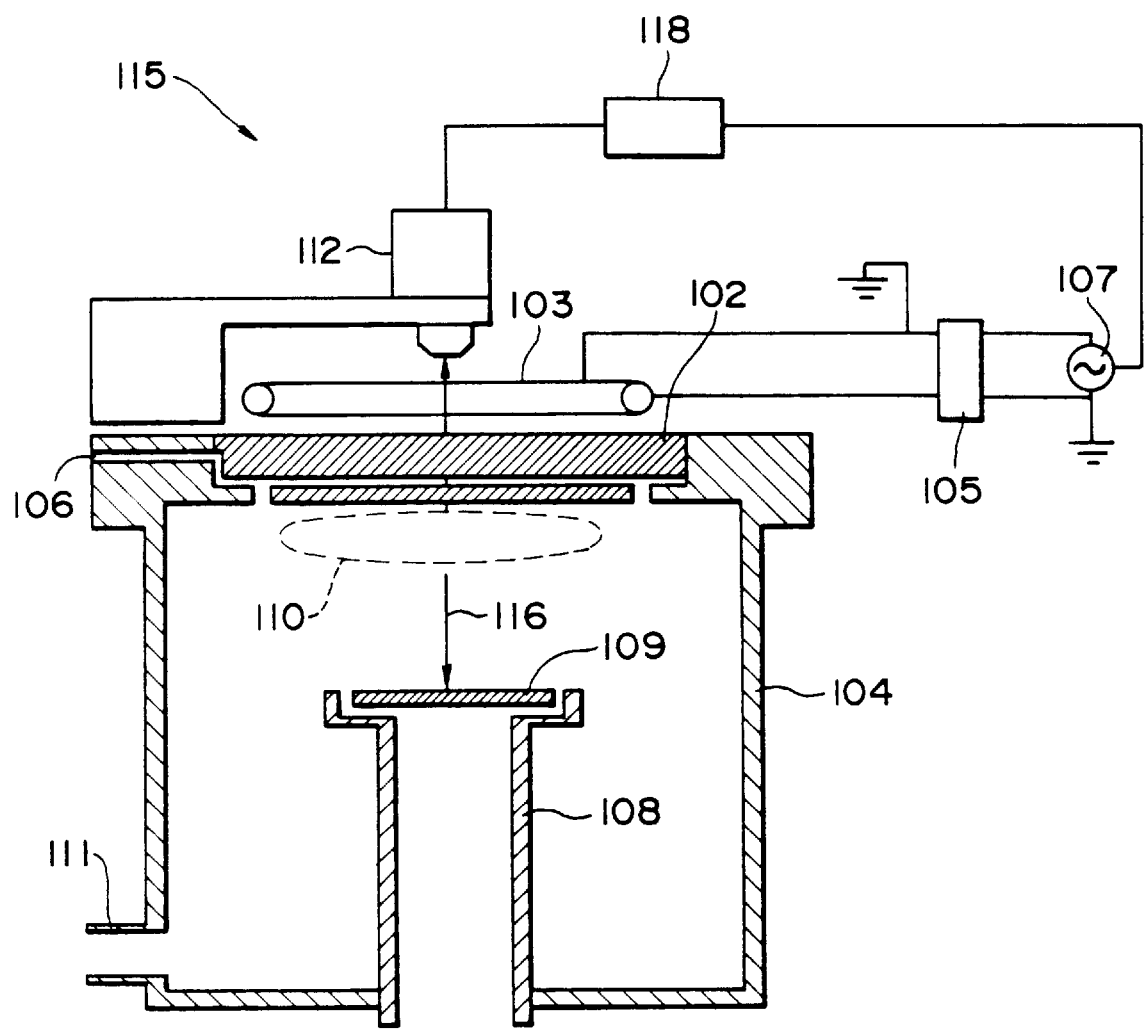
FIG. 7 is a schematic view showing the construction of a plasma CVD system according to an embodiment of a fifth invention.
Figure 8:
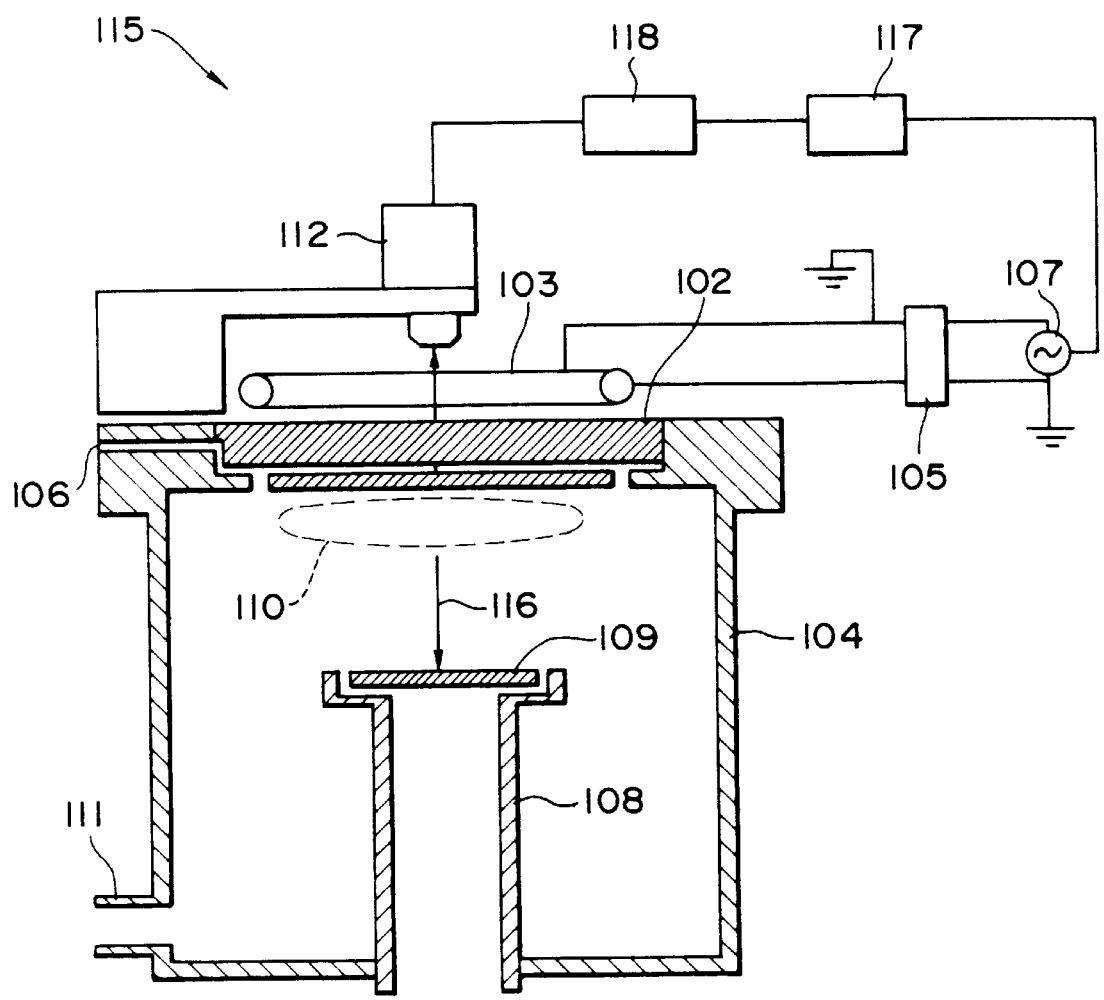
FIG. 8 is a schematic view showing the construction of a plasma CVD system according to an embodiment of a sixth invention.

FIG. 5 is a schematic view showing the construction of a plasma CVD system according to an embodiment of the third invention; FIG. 6 is a schematic view showing a sample viewed from the antenna side shown in FIG. 5; FIG. 7 is a schematic view showing the construction of a plasma CVD system according to another embodiment; and FIG. 8 is a schematic view showing the construction of a plasma CVD system according to a further embodiment.

Referring to FIG. 5, a cylindrical plasma CVD system 101 includes a vacuum chamber 104 having a gas inlet 106 and an exhaust port 111 for evacuation; a dielectric viewing port 102 made of transparent quartz glass, which is provided along the center axis of the vacuum vessel 104; an antenna 103 disposed in close proximity to the dielectric viewing port 102; a high frequency power supply 107 for supplying a high frequency power to the antenna 103 by way of a matching circuit 105; and a sample stage 108 for mounting the sample 109, which is disposed so as to be movable to a specified position along the center axis of the vacuum vessel 104.

In the above system, a CVD gas supplied from the gas inlet 106 is introduced, by way of a gas passage 106a provided on the dielectric viewing port, in the vacuum vessel 104 from a gas exhaust port 106b.

When the CVD process gas is introduced in the vacuum vessel 104 while a high frequency power is applied to the antenna 103 from the high frequency power supply 107, a high frequency electric field is induced in the vacuum vessel 104 by an electromagnetic wave from the antenna 103. The high frequency electric field accelerates electrons generated in the vacuum vessel 104 by natural radiation and the like. The accelerated electrons collide with neutral atoms in the CVD process gas, to ionize the neutral atoms into ions and electrons. The newly generated electrons are accelerated by the high frequency electric filed, to produce ions and electrons. This process is repeated. When the plasma density is thus increased somewhat, the electron density in the bulk plasma is increased, thereby increasing the responsive frequency of the electrons in the bulk plasma. The bulk plasma acts as an electric conductor, so that a current flows in a manner to shield the high frequency electric field, thus starting the cut-off of the electromagnetic wave. At this time, since the electromagnetic wave does not enter the interior of the bulk plasma, other than the special mode inherent to the plasma, only the plasma particles on the surface of the bulk plasma obtain the energy of the electromagnetic wave from the antenna, to further increase the plasma density, thus diffusing within the bulk plasma.

The decomposed product material produced by the plasma 110 thus generated is deposited on the sample 109. The portion (on which a film is deposited) of the surface of the sample 109 is located at the position not to be directly exposed to the plasma 110 by the movement of the sample stage 108. This makes it possible to form the dense CVD film without inclusion of impurities. Since the CVD process gas is introduced from the dielectric viewing port 102 formed of quartz glass into the vacuum vessel 104, any metal does not exist on the portion exposed to the plasma 110, thus ensuring the formation of the dense CVD film without impurities.

As shown in FIG. 5, the dielectric viewing port 102 and the antenna 103 are formed to be larger in diameter than the sample 109, and further, the dielectric viewing port 102, antenna 103 and the sample 109 are disposed along the same axial direction such that the directions of the planes thereof correspond to each other. Consequently, as shown in FIG. 6, the whole surface of the sample 109 can be observed from the transparent dielectric viewing port 102. With this construction, it is possible to usually observe the state of the film formation on the surface of the sample 109.

Using the above construction capable of observing the surface of the sample 109, the film thickness during the film formation can be measured by a film thickness measuring device. This will be described below.

As shown in FIG. 7, a plasma CVD system 115 has the same construction as that shown in FIG. 5, except that a film thickness measuring device 112 is disposed in the axial direction of the vacuum vessel 104. The film thickness measuring device 112 is intended to measure a film thickness on the basis of the spectrum of the light reflected from the surface of the film. A light 116 for measurement is radiated to the sample 109 through the transparent dielectric viewing port 102. The measuring device 112 catches the reflected light for spectroscopic analysis, and calculates the film thickness on the basis of the period of the spectrum using a computer 118. The film thickness measuring device 112 used in this embodiment takes about two seconds for one measurement and calculation of the film thickness; accordingly, the film thickness and the deposition rate are measured per two seconds.

The film formation can be controlled on the basis of the output of the measured value obtained by the film thickness measuring device 112. This will be described below.

In FIG. 8, a plasma CVD system 115 has the same construction as that shown in FIG. 7, except for a controller 117. The controller 117 is operated on the basis of the output value transmitted from the computer 118 which calculates the film thickness from the measured data obtained by the film thickness measuring device 112, to control the high frequency power supply 107. The film thickness during the film formation is measured by the film thickness measuring device 112 and the computer 118. When the film thickness reaches a specified value, the controller 117 is operated on the basis of the output signal from the computer 118, to stop the output of the high frequency power supply 107. The high frequency power applied to the vacuum vessel 104 is thus stopped, completing the film formation.

In the above construction, one kind of the film is controlled; however, a plurality of kinds of films can be continuously controlled using the film thickness measuring device 12 capable of detecting a film thickness. The eighth invention relates to such a CVD process. In this embodiment, there will be described a continuous film forming method wherein a PSG film is formed on a silicon wafer.

A silicon wafer, in which ion implantation for gate electrode and source drain is completed, is used as the sample 109. The sample 109 is disposed in the vacuum vessel 104. First, a CVD process gas containing a source gas TEOS (tetra-ethyl-ortho-silicate), a reaction gas $N_2O$ (dinitrogen monoxide) and a rare gas (Ar gas) is introduced, to form a silicon dioxide film on the surface of the sample 109 to a thickness of 500 Å. Next, a $PH_4$ gas is newly introduced in the vacuum vessel 104 while not stopping the generation of plasma, to form a PSG film with a thickness of 800 Å. After that, the PSG film is subjected to reflow for planarization.

According to this method, the continuous films are formed by process gases with the different components and different mixing ratio while not stopping the generation of plasma, so that two kinds of films such as NSG-PSG can be simply formed. Moreover, since the repeating of on-off of plasma is reduced, the process gases are not exposed to the instable plasma directly after generation, thus forming the CVD films with a stable quality.

As described above, the third invention provides the plasma CVD system using the ICP system enabling the plasma density distribution not to be directly affected by the non-uniformity of the high frequency power, wherein the film formation can be performed under the state that the sample is not exposed to the plasma, thus making it possible to obtain the film with no impurities.

According to the fourth invention, the dielectric viewing port has a gas passage for a CVD process gas and a gas exhaust port opened to the vacuum vessel. The CVD process gas is introduced in the vacuum vessel by way of the gas passage and the gas exhaust port, and thereby the process gas is uniformly supplied into the plasma generation area, thus preventing the inclusion of impurities.

According to the fifth invention, the transparent dielectric viewing port and the antenna are formed to be larger in diameter than the sample. The dielectric viewing port, antenna and sample are disposed along the same axis such that the directions of the planes thereof correspond to each other. This makes it possible to observe the state of the film formation on the surface of the sample through the transparent dielectric viewing port.

In the sixth invention, the film thickness measuring device is disposed for usually measuring the film thickness of the sample during the film formation within the vacuum vessel. Accordingly, it is possible to measure the distribution of the film on the sample, and to control the stoppage of the operation of the system when the film reaches the specified value.

The seventh invention provides the CVD system capable of forming a film with a constant thickness, wherein the film thickness of the film on the sample is measured by the film thickness measuring device, and the high frequency power from the antenna is controlled to be stopped when the measured value reaches a specified thickness.

The eighth invention provides the CVD system capable of continuously forming films of different kinds, wherein the film thickness of a film on the sample is measured by the film thickness measuring system, and either or both of the components and mixing ratio of the CVD process gases are changed when the film thickness reaches a specified value.

Next, a CVD system according to the ninth invention will be described with reference to FIGS. 9 to 12, wherein an antenna serving as the target material for sputtering is disposed in the vacuum vessel for preventing the generation of the cut-off of the high frequency power due to the sticking of sputter particles on the dielectric viewing port.

Figure 9:
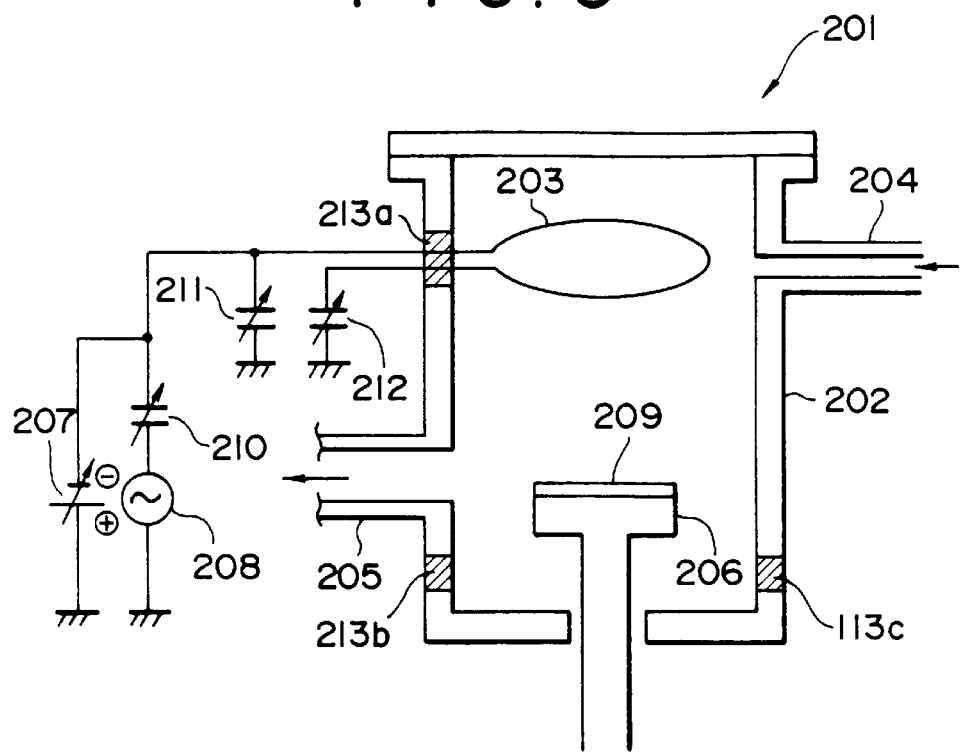
FIG. 9 is a schematic view shown in the construction of a sputtering system by ICP according to a first embodiment of a tenth invention.
Figure 10:
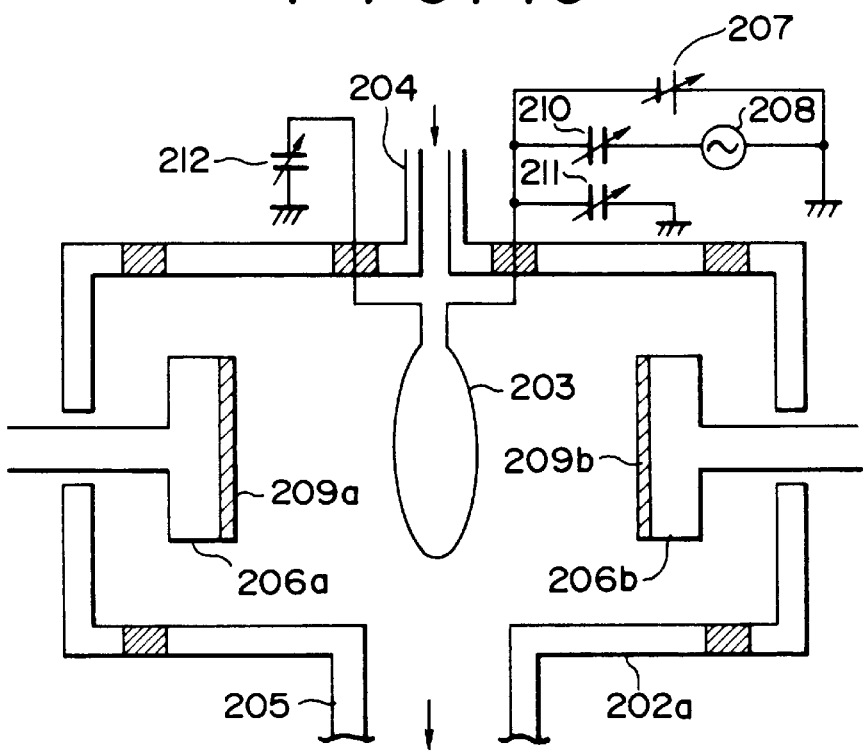
FIG. 10 is a schematic view showing a sputtering system by ICP according to a second embodiment of a tenth invention.
Figure 11A:
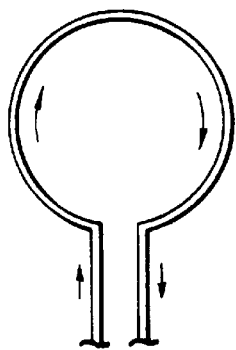
FIGS. 11A to 11E are schematic views showing examples of antenna shapes according to an embodiment.
Figure 11B:
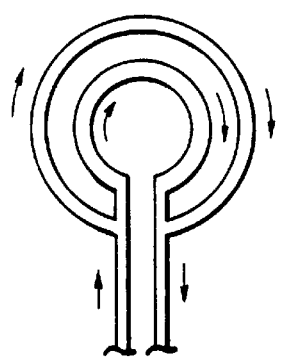
Figure 11C:
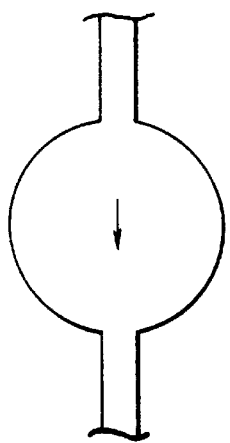
Figure 11D:
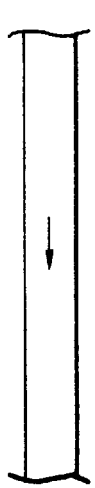
Figure 11E:
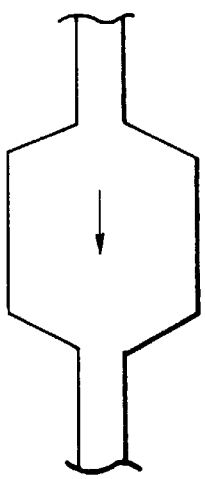
Figure 12:
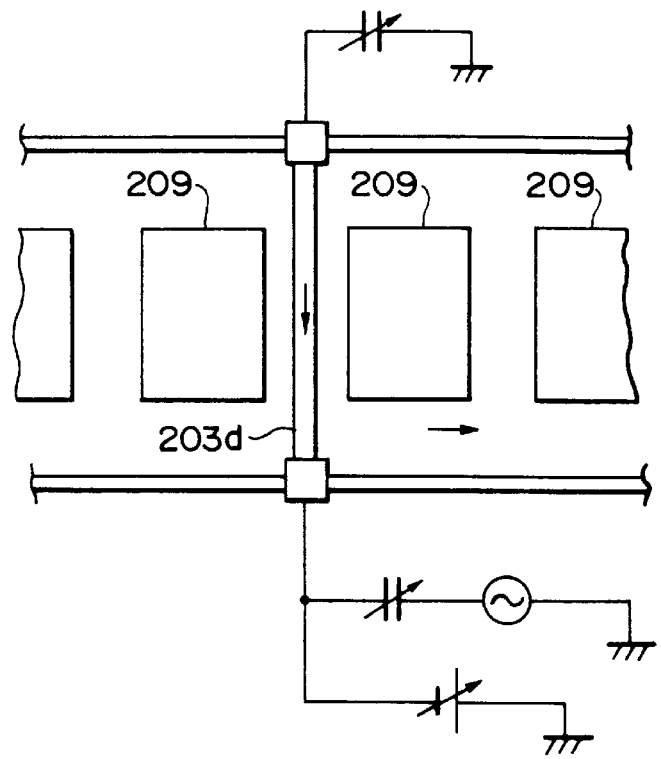
FIG. 12 is a schematic view showing an example of a system according to an embodiment in an inline process.
Figure 13:
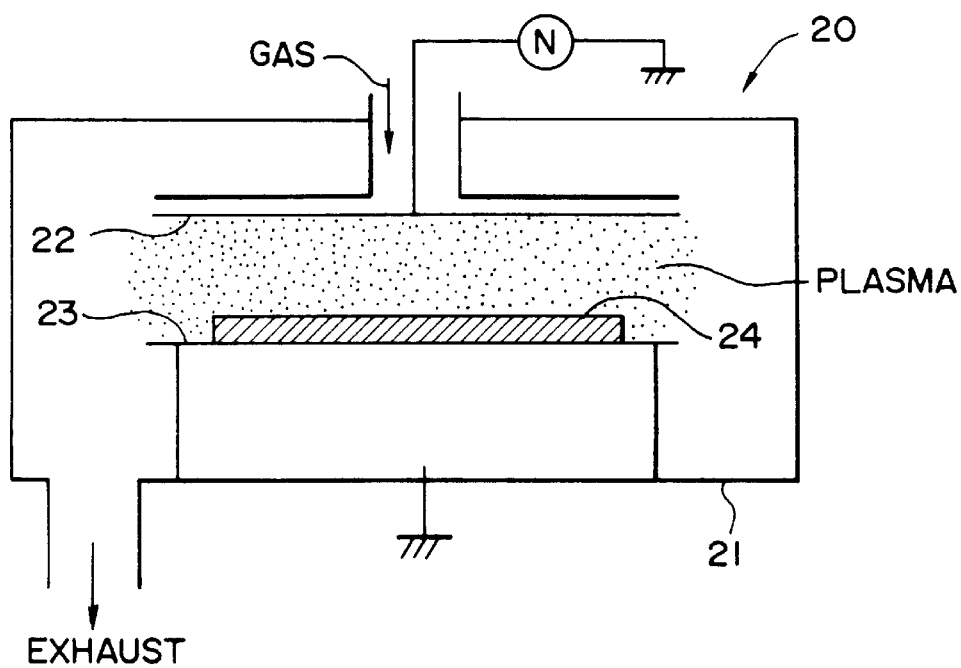
FIG. 13 is a schematic view showing a construction of a prior art parallel plate plasma CVD system.
Figure 14:
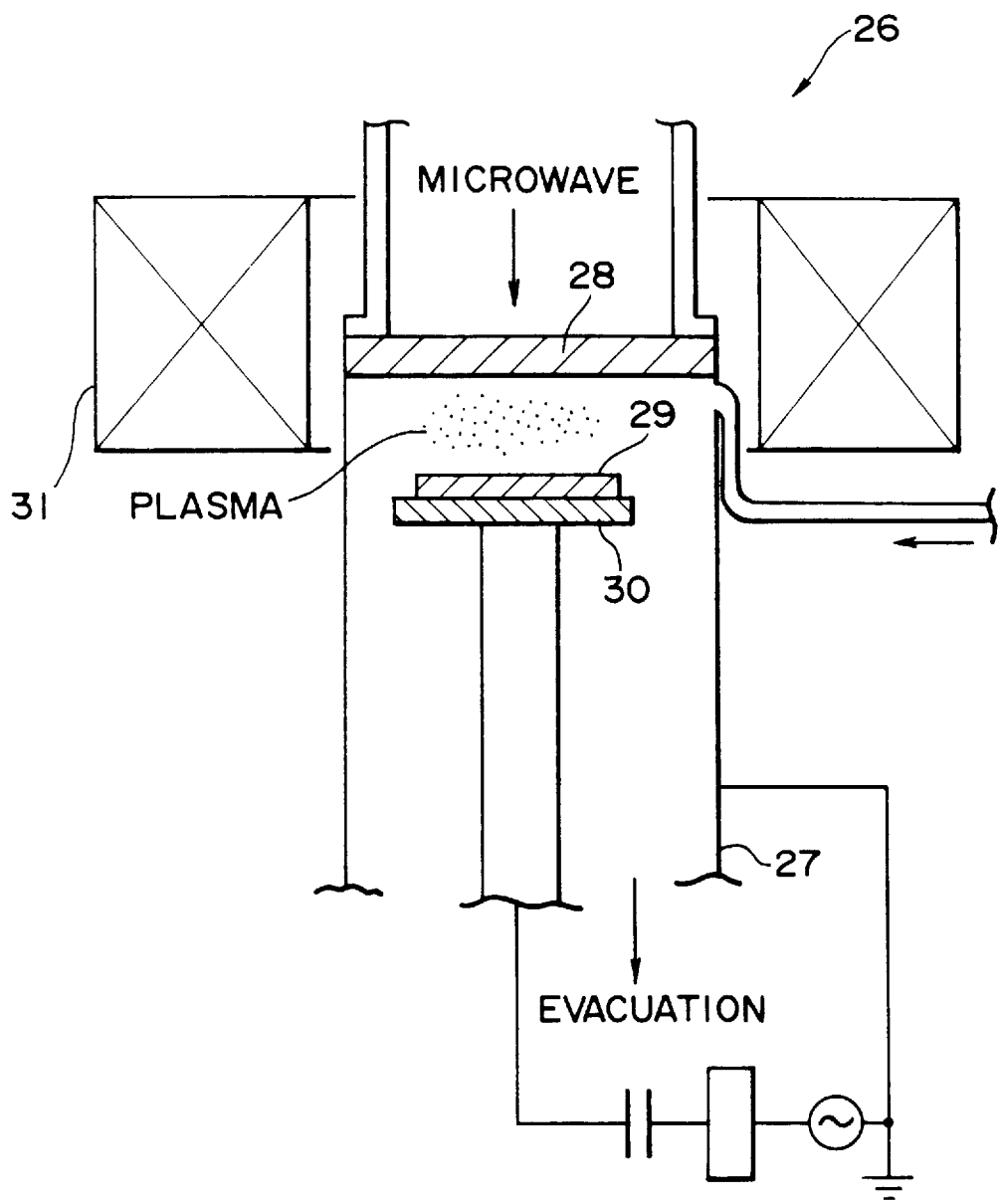
FIG. 14 is a schematic view showing the construction of a prior art ECR plasma CVD system.

FIG. 9 is a schematic view showing the construction of a sputtering system by the ICP system according to a first embodiment of the ninth invention; FIG. 10 is a schematic view of a sputtering system according to a second embodiment of the ninth invention; FIGS. 11A to 11E are schematic views showing the various examples of shapes of the antennas according to an embodiment; and FIG. 12 is a schematic view showing the inline type system of an embodiment.

In FIG. 9, a sputtering system 201 according to the first embodiment of the ninth invention includes a cylindrical vacuum vessel 202 having an inside diameter of 300 mm. In the vacuum vessel 202, an antenna 203 serving as a target material is disposed so as to be wound in one loop with a diameter of 100 mm. The vacuum vessel 202 includes an exhaust port 205 connected to an exhaust pump (not shown); a gas inlet pot 204 for introducing a process gas in the vacuum vessel 202; and a movable sample stage 206 for holding a sample 209 to be subjected to sputtering. The antenna 203 is connected to a high frequency power supply 208 and a bias power supply 207 to be applied with a dc bias. Variable capacitors 210, 211 and 212 form a matching circuit for supplying a high frequency power to the antenna 203, and which serves as a direct current suppression circuit. In addition, the antenna 203 is formed of a hollow structure to be cooled with water, which is not shown in the figure. Insulating portions 213a, 213b and 213c of the vacuum vessel 202, while being not shown, are formed at dead spaces not to be conductive with the metal film deposited on the surfaces thereof.

The process for generation of plasma and spattering by the ICP system using the above-described construction will be described below.

When a high frequency power is applied to the interior of the vacuum vessel 202, a high frequency electric field is induced in the vacuum chamber 202. The high frequency electric field accelerates electrons generated from the process gas introduced within the vacuum vessel 202 by natural radiation and the like. The accelerated electrons collide with neutral atoms, to ionize the neutral atoms into ions and electrons, thus generating the initial plasma. The electrons produced by the ionization is further accelerated by the high frequency electric field to keep the ionized state. This process is repeated, and thereby the plasma density is increased. The moving velocity of the electrons in the plasma is thus increased up to the value following the high frequency electric field. After that, the high frequency cannot be propagated within the plasma by the movement of the electrons for neutralizing the high frequency electric field on the surface of the bulk plasma in close proximity to the antenna 203. As a result, only the electrons in close proximity to the antenna 203 obtain the high frequency energy, and the high density plasma particles are produced, which diffuse in the interior of the bulk plasma. Accordingly, the high density plasma can be obtained in close proximity to the antenna 203. The ions of the process gas produced by the plasma are attracted and accelerated toward the antenna 203 serving as the target material by the bias voltage applied to the antenna 203. They collide with the antenna 203 and transmit the kinetic energy thereof to the metal crystal lattice of the target material, thus giving the energy exceeding the bonding energy of the metal crystal lattice. As a result, metal particles are released from the surface of the target material. The metal particles reaches the surface of the sample 209 disposed within the vacuum vessel 202, being slightly moved on the surface, and reform the metal crystal at the stable position, thus forming the thin film of the metal material on the surface of the sample 209.

As shown in the above process, since the antenna 203 serving as the target material is disposed in the vacuum vessel 202, an area with a high plasma density is formed in close proximity to the target material. Accordingly, it is possible to effectively perform the sputtering, and to eliminate the cut-off of the high frequency power due to the deposition of the sputter particles on the wall surface of the chamber, which has been a problem in the prior art ICP system.

Using the system having the above construction, an aluminum thin film is formed on the surface of a silicon wafer having a diameter of 150 mm as the sample 209 by sputtering.

The sample 209 is mounted on the sample stage 206, and the sample stage 206 is moved such that the sample 209 is located at the position separated from the antenna 203 by 200 mm. An argon gas (Ar) is introduced in the vacuum vessel 202, and plasma is generated under a gas pressure of $5 \times 10^{-3}$ Torr. The antenna 203, serving as the target material, is made of an aluminum alloy containing 1.5% of silicon (Si). A high frequency power of 500 W is supplied from the high frequency power supply 208, and a negative voltage of −600 V is applied from the bias power supply 207. Under this condition, the electron density in the plasma is $1 \times 10^{12}/$cm$^3$, and Al is deposited on the sample 209 with a deposition rate of 800 nm/min. Moreover, the uniformity of the deposition rate is within the range of ±10%.

The above antenna 203 may be formed of various shapes shown in FIGS. 11A to 11E for effectively achieving the generation of the plasma together with the effect as the target material. For example, when the sputtering is made under the above condition using an antenna having a disk-like shape shown in FIG. 11C, Al is deposited on the sample 209 (silicon wafer of 150 mm diameter) with a deposition rate of 800 nm/min. In addition, the uniformity of the deposition rate is within the range of ±6%.

FIG. 10 shows the construction of a second embodiment of the ninth invention for simultaneously performing the sputtering for a plurality of samples. In addition, components common to the first embodiment of the ninth invention are designated at the same symbols, and the explanation thereof is omitted.

In FIG. 10, sample stages 206a and 206b are disposed around the antenna 203 serving as the target material within the vacuum vessel 202a for holding the samples 209a and 209b respectively.

By use of the above construction wherein a plurality of samples are disposed within the vacuum vessel as described above, it is possible to effectively perform the sputtering process. Moreover, as schematically shown in FIG. 12, the sputtering can be performed in an inline process by continuously carrying the samples 209 within the vacuum vessel in which a linear antenna 203d is disposed.

The above embodiment shows the sputtering for forming an aluminum thin film on the surface of a silicon wafer. However, the sputtering for forming thin films of different materials and reactive sputtering can be also performed by changing the kinds of the antennas 203 serving as the targets and the process gases.

As described above, in the ICP system of the ninth invention, the antenna for inducing a high frequency electric field in the vacuum vessel is disposed in the vacuum vessel, and the antenna serves as the target material. Even if the shape of the antenna is simplified, there is no problem in generating plasma by the ICP system. Since being thus formed into a simple shape, the antenna can be disposed within the vacuum chamber. At the same time, by forming the antenna into a shape suitable for the target material, the antenna and the target material are simultaneously disposed within the generated plasma. Since the antenna is disposed within the vacuum chamber, is possible to eliminate the cut-off of the high frequency power which has been generated in the prior art construction by the inductive coupling from the outside of the vacuum vessel, and hence perform the stable sputtering.

In the constructions of the plasma CVD systems 101 and 115 described above, the deposited matter generated during the film formation is stuck on the dielectric viewing port 102 exposed to the plasma 110. This makes uneven the observation for the sample 109, the measurement by the film thickness measuring device 112 and the applying of the high frequency power from the antenna 103. To cope with this problem, the interior of the vacuum vessel 104 is usually washed for cleaning the dielectric viewing port 102. The tenth invention concerns the cleaning method for the interior of the vacuum vessel 104, which will be described below.

At the time when the film formation of the CVD film is completed, the gas introduced within the vacuum vessel 104 is changed into $NF_3$ gas. Thus, the plasma is generated at the same manner as the film formation, to remove the deposited matter stuck on the dielectric viewing port by the etching due to the plasma. When the deposited matter is silicon dioxide, the $NF_3$ gas plasma produces the silicon fluoride such as $SiF_x$. This fluoride is volatilized because of its high vapor pressure. In the etching for removing the deposited matter, the dielectric viewing port is also etched by the $NF_3$ gas plasma; however, the material generated by the etching is the same as the CVD film, and it does not exert an effect on the silicon wafer as the sample 109 so much.

According to the tenth invention, after the CVD process is performed wherein the CVD process gas is introduced in the vacuum vessel, a fluorine gas is introduced in the vacuum vessel in place of the CVD process gas to generate the plasma, thus removing the CVD film stuck on the dielectric viewing port by the etching due to plasma. The cleaning renews the transparent state of the dielectric viewing port and the introducing state of the high frequency power. The stable CVD film is continuously obtained by usually performing the cleaning.

What is claimed is:

1. A plasma CVD system, comprising:
   a dielectric viewing port, which is disposed on the outer periphery of a vacuum vessel, comprising a gas passage, in the dielectric viewing port, connected to an inlet port for a CVD process gas and a gas discharge port for discharging the process gas in said gas passage within said vacuum vessel;
   an antenna formed in a loop, which is disposed in close proximity to said dielectric viewing port provided outside of said vacuum vessel for inducing a high frequency electric field within said vacuum vessel; and
   a sample stage within said vacuum vessel;
   wherein said dielectric viewing port, said antenna and said sample stage are disposed along the axis of said vacuum vessel, such that the directions of the planes thereof are parallel to each other.

2. A plasma CVD system of claim 1, wherein said dielectric viewing port is made of a transparent material.

3. A plasma CVD system, comprising:
   a dielectric viewing port formed of a transparent dielectric with a diameter larger than that of a sample, which is disposed on the outer periphery of a vacuum vessel, and which comprises a gas passage, in the dielectric viewing port, connected to an inlet port for a CVD process gas and a gas discharge port for discharging the process gas in said gas passage within said vacuum vessel;
   an antenna formed in a loop with a diameter larger than that of said sample, which is disposed in close proximity to said dielectric viewing port provided outside of said vacuum vessel for inducing a high frequency electric field within said vacuum vessel; and
   a sample stage within said vacuum vessel;
   wherein said dielectric viewing port, said antenna and said sample stage are disposed along the axis of said vacuum vessel such that the directions of the planes thereof are parallel to each other.

4. A plasma CVD system, comprising:
   a dielectric viewing port formed of a transparent dielectric with a diameter larger than that of a sample, which is disposed on the outer periphery of a vacuum vessel, and which comprises a gas passage, in the dielectric viewing port, connected to an inlet port for a CVD process gas and a gas discharge port for discharging the process gas in said gas passage within said vacuum vessel;
   an antenna formed in a loop with a diameter larger than that of said sample, which is disposed in close proximity to said dielectric viewing port provided outside of said vacuum vessel for inducing a high frequency electric field within said vacuum vessel; and
   a sample stage within said vacuum vessel;
   said dielectric viewing port, said antenna and said sample stage are disposed along the axis of said vacuum vessel such that the directions of the planes thereof are parallel to each other; and
   a film thickness measuring device disposed at a position in which a detection light is emitted to said sample by way of said dielectric viewing port and receives light reflected from a film deposited on the surface of said sample, thereby measuring the film thickness of a deposited film by analysis of the reflected light.

* * * * *

UNITED STATES PATENT AND TRADEMARK OFFICE
CERTIFICATE OF CORRECTION

PATENT NO. : 5,824,158
DATED : October 20, 1998
INVENTOR(S) : Koichiro TAKEUCHI et al.

It is certified that error appears in the above-identified patent and that said Letters Patent is hereby corrected as shown below:

On the title page, item [30], Foreign Application Priority Data, the first line should be:

--Jun. 30, 1993 [JP] Japan ...........5-161441--

Signed and Sealed this

Fourth Day of May, 1999

Attest:

Q. TODD DICKINSON

Attesting Officer

Acting Commissioner of Patents and Trademarks